(12) United States Patent
Foughi et al.

(10) Patent No.: US 11,255,737 B2
(45) Date of Patent: Feb. 22, 2022

(54) INTEGRATED DIGITAL FORCE SENSORS AND RELATED METHODS OF MANUFACTURE

(71) Applicant: NEXTINPUT, INC., Mountain View, CA (US)

(72) Inventors: Ali Foughi, Atherton, CA (US); Ryan Diestelhorst, Atlanta, GA (US); Dan Benjamin, Atlanta, GA (US); Julius Minglin Tsai, San Jose, CA (US); Michael Dueweke, Campbell, CA (US)

(73) Assignee: NEXTINPUT, INC., Mountain Vew, CA (US)

( * ) Notice: Subject to any disclaimer, the term of this patent is extended or adjusted under 35 U.S.C. 154(b) by 0 days.

(21) Appl. No.: 16/485,016

(22) PCT Filed: Feb. 9, 2018

(86) PCT No.: PCT/US2018/017564
§ 371 (c)(1),
(2) Date: Aug. 9, 2019

(87) PCT Pub. No.: WO2018/148503
PCT Pub. Date: Aug. 16, 2018

(65) Prior Publication Data
US 2019/0383676 A1    Dec. 19, 2019

Related U.S. Application Data

(60) Provisional application No. 62/456,699, filed on Feb. 9, 2017, provisional application No. 62/469,094, filed on Mar. 9, 2017.

(51) Int. Cl.
*G01L 1/18* (2006.01)
*B81B 7/02* (2006.01)
(Continued)

(52) U.S. Cl.
CPC .................. *G01L 1/18* (2013.01); *B81B 7/02* (2013.01); *B81C 1/00246* (2013.01); *G01L 1/14* (2013.01);
(Continued)

(58) Field of Classification Search
CPC ..... G01L 1/18; G01L 1/16; G01L 1/14; G01L 1/2293; B81C 1/00246; B81C 2203/0714;
(Continued)

(56) References Cited

U.S. PATENT DOCUMENTS 4,594,639 A    6/1986  Kuisma
4,658,651 A    4/1987  Le
(Continued)

FOREIGN PATENT DOCUMENTS

CN    101341459 A    1/2009
CN    101458134 A    6/2009
(Continued)

OTHER PUBLICATIONS

PCT/US2018/017564, International Search Report and Written Opinion dated Jun. 15, 2018, 11 pages.
(Continued)

*Primary Examiner* — Octavia Hollington
(74) *Attorney, Agent, or Firm* — Meunier Carlin & Curfman LLC

(57) ABSTRACT

In one embodiment, a ruggedized wafer level microelectromechanical ("MEMS") force sensor includes a base and a cap. The MEMS force sensor includes a flexible membrane and a sensing element. The sensing element is electrically connected to integrated complementary metal-oxide-semiconductor ("CMOS") circuitry provided on the same substrate as the sensing element. The CMOS circuitry can be
(Continued)

configured to amplify, digitize, calibrate, store, and/or communicate force values through electrical terminals to external circuitry.

14 Claims, 7 Drawing Sheets

(51) Int. Cl.
    *B81C 1/00*     (2006.01)
    *G01L 1/14*     (2006.01)
    *G01L 1/16*     (2006.01)

(52) U.S. Cl.
    CPC ........ *G01L 1/16* (2013.01); *B81B 2201/0264* (2013.01); *B81B 2203/0127* (2013.01); *B81B 2203/0315* (2013.01); *B81B 2207/015* (2013.01); *B81B 2207/07* (2013.01); *B81C 2201/013* (2013.01); *B81C 2203/0109* (2013.01); *B81C 2203/0714* (2013.01); *B81C 2203/0728* (2013.01)

(58) Field of Classification Search
    CPC ...... B81C 2201/013; B81C 2203/0109; B81C 2203/0728; B81B 2207/07; B81B 7/02; B81B 2207/015; B81B 2201/0264; B81B 2203/0315; B81B 2203/0127; H01L 27/20
    USPC .................................................... 73/862.626
    See application file for complete search history.

(56) References Cited

U.S. PATENT DOCUMENTS

| | | | |
|---|---|---|---|
| 4,814,856 A | 3/1989 | Kurtz et al. | |
| 4,849,730 A | 7/1989 | Izumi et al. | |
| 4,914,624 A | 4/1990 | Dunthorn | |
| 4,918,262 A | 4/1990 | Flowers et al. | |
| 4,933,660 A | 6/1990 | Wynne | |
| 4,983,786 A | 1/1991 | Stevens | |
| 5,095,401 A | 3/1992 | Zavracky et al. | |
| 5,159,159 A | 10/1992 | Asher | |
| 5,166,612 A * | 11/1992 | Murdock ............... G01H 11/02 324/207.13 | |
| 5,237,879 A | 8/1993 | Speeter | |
| 5,320,705 A | 6/1994 | Fujii et al. | |
| 5,333,505 A | 8/1994 | Takahashi et al. | |
| 5,343,220 A | 8/1994 | Veasy et al. | |
| 5,349,746 A | 9/1994 | Gruenwald et al. | |
| 5,351,550 A | 10/1994 | Maurer | |
| 5,483,994 A | 1/1996 | Maurer | |
| 5,510,812 A | 4/1996 | O'Mara et al. | |
| 5,541,372 A | 7/1996 | Baller et al. | |
| 5,543,591 A | 8/1996 | Gillespie et al. | |
| 5,565,657 A | 10/1996 | Merz | |
| 5,600,074 A | 2/1997 | Marek et al. | |
| 5,673,066 A | 9/1997 | Toda et al. | |
| 5,773,728 A | 6/1998 | Tsukada et al. | |
| 5,889,236 A | 3/1999 | Gillespie et al. | |
| 5,921,896 A | 7/1999 | Boland | |
| 5,969,591 A | 10/1999 | Fung | |
| 6,012,336 A | 1/2000 | Eaton et al. | |
| 6,028,271 A | 2/2000 | Gillespie et al. | |
| 6,159,166 A | 12/2000 | Chesney et al. | |
| 6,243,075 B1 | 6/2001 | Fishkin et al. | |
| 6,348,663 B1 | 2/2002 | Schoos et al. | |
| 6,351,205 B1 | 2/2002 | Armstrong | |
| 6,360,598 B1 | 3/2002 | Calame et al. | |
| 6,437,682 B1 | 8/2002 | Vance | |
| 6,555,235 B1 | 4/2003 | Aufderheide et al. | |
| 6,556,189 B1 | 4/2003 | Takahata et al. | |
| 6,569,108 B2 | 5/2003 | Sarvazyan et al. | |
| 6,610,936 B2 | 8/2003 | Gillespie et al. | |
| 6,620,115 B2 | 9/2003 | Sarvazyan et al. | |
| 6,629,343 B1 | 10/2003 | Chesney et al. | |
| 6,668,230 B2 | 12/2003 | Mansky et al. | |
| 6,720,712 B2 | 4/2004 | Scott et al. | |
| 6,788,297 B2 | 9/2004 | Itoh et al. | |
| 6,801,191 B2 | 10/2004 | Mukai et al. | |
| 6,809,280 B2 | 10/2004 | Divigalpitiya et al. | |
| 6,812,621 B2 | 11/2004 | Scott | |
| 6,822,640 B2 | 11/2004 | Derocher | |
| 6,868,731 B1 * | 3/2005 | Gatesman ............... G01L 9/125 73/714 | |
| 6,879,318 B1 | 4/2005 | Chan et al. | |
| 6,888,537 B2 | 5/2005 | Benson et al. | |
| 6,915,702 B2 | 7/2005 | Omura et al. | |
| 6,931,938 B2 | 8/2005 | Knirck et al. | |
| 6,995,752 B2 | 2/2006 | Lu | |
| 7,138,984 B1 | 11/2006 | Miles | |
| 7,173,607 B2 | 2/2007 | Matsumoto et al. | |
| 7,190,350 B2 | 3/2007 | Roberts | |
| 7,215,329 B2 | 5/2007 | Yoshikawa et al. | |
| 7,218,313 B2 | 5/2007 | Marcus et al. | |
| 7,224,257 B2 | 5/2007 | Morikawa | |
| 7,245,293 B2 | 7/2007 | Hoshino et al. | |
| 7,273,979 B2 | 9/2007 | Christensen | |
| 7,280,097 B2 | 10/2007 | Chen et al. | |
| 7,318,349 B2 | 1/2008 | Vaganov et al. | |
| 7,324,094 B2 | 1/2008 | Moilanen et al. | |
| 7,324,095 B2 | 1/2008 | Sharma | |
| 7,336,260 B2 | 2/2008 | Martin et al. | |
| 7,337,085 B2 | 2/2008 | Soss | |
| 7,345,680 B2 | 3/2008 | David | |
| 7,367,232 B2 | 5/2008 | Vaganov | |
| 7,406,661 B2 | 7/2008 | Väänänen et al. | |
| 7,425,749 B2 | 9/2008 | Hartzell et al. | |
| 7,426,873 B1 | 9/2008 | Kholwadwala et al. | |
| 7,449,758 B2 | 11/2008 | Axelrod et al. | |
| 7,460,109 B2 | 12/2008 | Satai et al. | |
| 7,476,952 B2 | 1/2009 | Vaganov et al. | |
| 7,508,040 B2 | 3/2009 | Nikkei et al. | |
| 7,554,167 B2 | 6/2009 | Vaganov | |
| 7,607,111 B2 | 10/2009 | Vaananen et al. | |
| 7,620,521 B2 | 11/2009 | Breed et al. | |
| 7,629,969 B2 | 12/2009 | Kent | |
| 7,649,522 B2 | 1/2010 | Chen et al. | |
| 7,663,612 B2 | 2/2010 | Bladt | |
| 7,685,538 B2 | 3/2010 | Fleck et al. | |
| 7,698,084 B2 | 4/2010 | Soss | |
| 7,701,445 B2 | 4/2010 | Inokawa et al. | |
| 7,746,327 B2 | 6/2010 | Miyakoshi | |
| 7,791,151 B2 | 9/2010 | Vaganov et al. | |
| 7,819,998 B2 | 10/2010 | David | |
| 7,825,911 B2 | 11/2010 | Sano et al. | |
| 7,829,960 B2 | 11/2010 | Takizawa | |
| 7,903,090 B2 | 3/2011 | Soss et al. | |
| 7,921,725 B2 | 4/2011 | Silverbrook et al. | |
| 7,952,566 B2 | 5/2011 | Poupyrev et al. | |
| 7,973,772 B2 | 7/2011 | Gettemy et al. | |
| 7,973,778 B2 | 7/2011 | Chen | |
| 8,004,052 B2 | 8/2011 | Vaganov | |
| 8,004,501 B2 | 8/2011 | Harrison | |
| 8,013,843 B2 | 9/2011 | Pryor | |
| 8,026,906 B2 | 9/2011 | Mölne et al. | |
| 8,044,929 B2 | 10/2011 | Baldo et al. | |
| 8,068,100 B2 | 11/2011 | Pryor | |
| 8,072,437 B2 | 12/2011 | Miller et al. | |
| 8,072,440 B2 | 12/2011 | Pryor | |
| 8,096,188 B2 | 1/2012 | Wilner | |
| 8,113,065 B2 | 2/2012 | Ohsato et al. | |
| 8,120,586 B2 | 2/2012 | Hsu et al. | |
| 8,120,588 B2 | 2/2012 | Klinghult | |
| 8,130,207 B2 | 3/2012 | Nurmi et al. | |
| 8,134,535 B2 | 3/2012 | Choi et al. | |
| 8,139,038 B2 | 3/2012 | Chueh et al. | |
| 8,144,133 B2 | 3/2012 | Wang et al. | |
| 8,149,211 B2 | 4/2012 | Hayakawa et al. | |
| 8,154,528 B2 | 4/2012 | Chen et al. | |
| 8,159,473 B2 | 4/2012 | Cheng et al. | |
| 8,164,573 B2 | 4/2012 | DaCosta et al. | |
| 8,183,077 B2 | 5/2012 | Vaganov et al. | |
| 8,184,093 B2 | 5/2012 | Tsuiki | |

(56) References Cited

U.S. PATENT DOCUMENTS

| | | |
|---|---|---|
| 8,188,985 B2 | 5/2012 | Hillis et al. |
| 8,199,116 B2 | 6/2012 | Jeon et al. |
| 8,212,790 B2 | 7/2012 | Rimas-Ribikauskas et al. |
| 8,237,537 B2 | 8/2012 | Kurtz et al. |
| 8,243,035 B2 | 8/2012 | Abe et al. |
| 8,250,921 B2 | 8/2012 | Nasiri et al. |
| 8,253,699 B2 | 8/2012 | Son |
| 8,260,337 B2 | 9/2012 | Periyalwar et al. |
| 8,269,731 B2 | 9/2012 | Molne |
| 8,289,288 B2 | 10/2012 | Whytock et al. |
| 8,289,290 B2 | 10/2012 | Klinghult |
| 8,297,127 B2 | 10/2012 | Wade et al. |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | The et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |
| 8,482,372 B2 | 7/2013 | Kurtz et al. |
| 8,493,189 B2 | 7/2013 | Suzuki |
| 8,497,757 B2 | 7/2013 | Kurtz et al. |
| 8,516,906 B2 | 8/2013 | Umetsu et al. |
| 8,931,346 B2 | 1/2015 | Donzier et al. |
| 8,973,446 B2 * | 3/2015 | Fukuzawa ............... G01L 1/12 73/779 |
| 8,984,951 B2 | 3/2015 | Landmann et al. |
| 9,032,818 B2 * | 5/2015 | Campbell ............... G01L 1/18 73/862.628 |
| 9,097,600 B2 | 8/2015 | Khandani |
| 9,487,388 B2 | 11/2016 | Brosh |
| 9,493,342 B2 | 11/2016 | Brosh |
| 9,709,509 B1 * | 7/2017 | Yang ............... G01N 21/9501 |
| 9,772,245 B2 | 9/2017 | Besling et al. |
| 10,962,427 B2 | 3/2021 | Youssefi et al. |
| 2001/0009112 A1 | 7/2001 | Delaye |
| 2003/0067448 A1 | 4/2003 | Park |
| 2003/0128181 A1 | 7/2003 | Poole |
| 2003/0189552 A1 | 10/2003 | Chuang et al. |
| 2004/0012572 A1 | 1/2004 | Sowden et al. |
| 2004/0140966 A1 | 7/2004 | Marggraff et al. |
| 2005/0083310 A1 | 4/2005 | Safai et al. |
| 2005/0190152 A1 | 9/2005 | Vaganov |
| 2006/0028441 A1 | 2/2006 | Armstrong |
| 2006/0244733 A1 | 11/2006 | Geaghan |
| 2006/0272413 A1 | 12/2006 | Vaganov et al. |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1 | 5/2007 | Laitinen et al. |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0245836 A1 | 10/2007 | Vaganov |
| 2007/0262965 A1 | 11/2007 | Hirai et al. |
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0083962 A1 | 4/2008 | Vaganov |
| 2008/0088600 A1 | 4/2008 | Prest et al. |
| 2008/0088602 A1 | 4/2008 | Hotelling |
| 2008/0094367 A1 | 4/2008 | Van De Ven et al. |
| 2008/0105057 A1 | 5/2008 | Wade |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237275 A1 | 9/2009 | Vagnov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0102403 A1 | 4/2010 | Celik-Butler et al. |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti |
| 2010/0323467 A1 | 12/2010 | Vaganov et al. |
| 2010/0328229 A1 | 12/2010 | Weber et al. |

(56) References Cited

U.S. PATENT DOCUMENTS

| | | |
|---|---|---|
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christoffersen |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0032907 A1 | 2/2012 | Koizumi et al. |
| 2012/0032915 A1 | 2/2012 | Wittorf |
| 2012/0038579 A1 | 2/2012 | Sasaki |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |
| 2012/0061823 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mënpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0215212 A1 | 8/2012 | Yu et al. |
| 2012/0234112 A1 | 9/2012 | Umetsu et al. |
| 2012/0256237 A1 | 10/2012 | Lakamraju et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1 | 6/2013 | Chen et al. |
| 2013/0187201 A1 | 7/2013 | Elian |
| 2013/0239700 A1 | 9/2013 | Benfield et al. |
| 2013/0255393 A1 | 10/2013 | Fukuzawa et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0090488 A1 | 4/2014 | Taylor et al. |
| 2014/0283604 A1* | 9/2014 | Najafi .................. G01P 15/125 73/514.32 |
| 2014/0367811 A1 | 12/2014 | Nakagawa et al. |
| 2015/0110295 A1* | 4/2015 | Jenkner ................ H04R 29/004 381/114 |
| 2015/0241465 A1 | 8/2015 | Konishi |
| 2016/0069927 A1 | 3/2016 | Hamamura |
| 2016/0245667 A1 | 8/2016 | Najafi et al. |
| 2016/0332866 A1 | 11/2016 | Brosh et al. |
| 2016/0363490 A1 | 12/2016 | Campbell et al. |
| 2017/0103246 A1 | 4/2017 | Pi et al. |
| 2017/0234744 A1 | 8/2017 | Tung et al. |
| 2019/0383675 A1 | 12/2019 | Tsai et al. |
| 2020/0149983 A1* | 5/2020 | Tsai ..................... H01L 41/053 |
| 2020/0234023 A1 | 7/2020 | Tsai et al. |

FOREIGN PATENT DOCUMENTS

| | | |
|---|---|---|
| CN | 101801837 A | 8/2010 |
| CN | 201653605 | 11/2010 |
| CN | 101929898 A | 12/2010 |
| CN | 102062662 A | 5/2011 |
| CN | 102998037 | 3/2013 |
| CN | 103308239 A | 9/2013 |
| CN | 102853950 A | 3/2015 |
| CN | 104535229 | 4/2015 |
| CN | 104581605 A | 4/2015 |
| CN | 104919293 A | 9/2015 |
| CN | 105934661 A | 9/2016 |
| DE | 102010012441 | 9/2011 |
| JP | 2004-156937 | 6/2004 |
| JP | 2010147268 | 7/2010 |
| WO | 93/10430 A | 5/1993 |
| WO | 2004/113859 | 12/2004 |
| WO | 2007/139695 | 12/2007 |
| WO | 2011/065250 A1 | 6/2011 |
| WO | 2013/067548 | 5/2013 |
| WO | 2015/106246 A | 7/2015 |
| WO | 2019/023552 | 1/2019 |

OTHER PUBLICATIONS

Mei, T., et al., "Design and Fabrication of an Integrated Three-Dimensional Tactile Sensor for Space Robotic Applications," Micro Electro Mechanical Systems, MEMS '99, Twelfth IEEE International Conference, Orlando Florida, Jan. 21, 1999, pp. 112-117.

Nesterov, V., et al., "Modelling and investigation of the silicon twin design 3D micro probe," Journal of Micromechanics and Microengineering, vol. 15, 2005, pp. 514-520.

Extended European Supplementary Search Report issued in EP 18751209.0, dated Oct. 22, 2020 (7 pages).

Office Action issued for Chinese Application No. 201880023913.1, dated Dec. 25, 2020 (with English-language translation).

Office Action issued for Chinese Application No. 201880023913.1, dated Sep. 10, 2021 (with English-language translation).

* cited by examiner

| Output | $D_1$ | $D_2$ |
|---|---|---|
| $F < f_1$ | 0 | 0 |
| $f_1 < F < f_2$ | 0 | 1 |
| $f_2 < F < f_3$ | 1 | 0 |
| $F > f_3$ | 1 | 1 |

*FIG. 11*

INTEGRATED DIGITAL FORCE SENSORS AND RELATED METHODS OF MANUFACTURE

CROSS-REFERENCE TO RELATED APPLICATIONS

This application is a 35 USC 371 national phase application of PCT/US2018/017564 filed on Feb. 9, 2018, which claims the benefit of U.S. provisional patent application No. 62/456,699, filed on Feb. 9, 2017, and entitled "INTEGRATED DIGITAL FORCE SENSOR," and U.S. provisional patent application No. 62/469,094, filed on Mar. 9, 2017, and entitled "SOLID STATE MECHANICAL SWITCH," the disclosures of which are expressly incorporated herein by reference in their entireties.

FIELD OF THE INVENTION

The present disclosure relates to microelectromechanical ("MEMS") force sensing dies, MEMS switches, and related methods of manufacture. The MEMS force sensing dies and/or MEMS switches can be used for converting force into a digital output code.

BACKGROUND

Current technology MEMS force dies are based on linking the applied force to a sensing diaphragm having strain gauges located on a surface of two or more stacked silicon or glass die. Wire bond pads are positioned around the sensing diaphragm and the resulting structure is packaged, which makes the device relatively large compared to more modern chip-scale packaged sensors and electronics. In addition, current MEMS force dies produce an analog output that must often be routed through an often noisy electrical environment before it is converted to a digital signal.

Current electromechanical switches consist primarily of conductive dome structures that deform to complete an electrical circuit. These switches are limited in their durability as the conductive material, often metal, wears over time. These switches are also incapable of being configured for multiple levels of actuation, which is becoming more desirable as software applications are growing in complexity and require more versatility from the user interfaces designed to control them.

Accordingly, there is a need in the pertinent art for a small, low-cost, digital force sensor.

SUMMARY

A MEMS force sensor including a plurality of sensing elements and digital circuitry positioned on a surface of the force sensor die is described herein. Each sensing element can include a flexure and a sensing element (e.g., piezoresistive strain gauge). In one implementation, four sensing elements can be employed, although additional or fewer sensing elements can also be used. The inclusion of MEMS in a standard complementary metal-oxide-semiconductor ("CMOS") process allows the sensor to convert its analog output into digital codes and transmit them without loss of signal integrity due to electrical noise.

The MEMS force sensors described herein can be manufactured by bonding a cap wafer to a base wafer (e.g., a force sensor die) that has both the sensing element(s) (e.g., piezoresistive strain gauge(s)) and CMOS power, processing, and communication circuitry. Sensing elements can be formed by etching flexures on the top side of the base wafer. The bond between the base and cap wafers can include a gap produced by protrusions sculptured either on the top of the base wafer and/or on the bottom of the cap wafer. The gap can be designed to limit the displacement of the cap wafer in order to provide force overload protection for the MEMS force sensors. The protrusions and outer wall of the base wafer deflect with applied force, straining the sensing element(s) and producing an analog output signal. The analog output signal can be digitized and stored in on-chip registers of the CMOS circuitry until requested by a host device.

A wafer level MEMS mechanical switch including a base and a cap is also described herein. The mechanical switch employs at least one sensing element. The at least one sensing element is electrically connected to integrated CMOS circuitry on the same substrate. The CMOS circuitry can amplify, digitize, and calibrate force values, which are compared to programmable force thresholds to modulate digital outputs.

A MEMS switch including a plurality of sensing elements positioned on the surface of the switch die is also described herein. In one implementation, four sensing elements can be employed, although additional or fewer sensing elements may also be used. The sensing elements can have their analog outputs digitized and compared against multiple programmed force levels, outputting a digital code to indicate the current state of the switch.

The MEMS switch can be made compact as to only require a small number of input/output ("I/O") terminals. The outputs of the device can be configured to indicate $2^N$ input force levels, where N is the number of output terminals, which can be programmed by the user. In addition, the device's response can optionally be filtered such that only dynamic forces are measured. The resulting device is a fully-configurable, multi-level, dynamic digital switch.

An example MEMS force sensor is described herein. The MEMS force sensor can include a sensor die configured to receive an applied force. The sensor die has a top surface and a bottom surface opposite thereto. The MEMS force sensor can also include a sensing element and digital circuitry arranged on the bottom surface of the sensor die. The sensing element can be configured to convert a strain on the bottom surface of the sensor die to an analog electrical signal that is proportional to the strain. Additionally, the digital circuitry can be configured to convert the analog electrical signal to a digital electrical output signal.

Additionally, the sensing element can be a piezoresistive, piezoelectric, or capacitive transducer.

Alternatively or additionally, the MEMS force sensor can further include a plurality of electrical terminals arranged on the bottom surface of the sensor die. The digital electrical output signal produced by the digital circuitry can be routed to the electrical terminals. For example, the electrical terminals can be solder bumps or copper pillars.

Alternatively or additionally, the MEMS force sensor can further include a cap attached to the sensor die. The cap can be bonded to the sensor die at a surface defined by an outer wall of the sensor die. In addition, a sealed cavity can be formed between the cap and the sensor die.

Alternatively or additionally, the sensor die can include a flexure formed therein. The flexure can convert the applied force into the strain on the bottom surface of the sensor die. Optionally, the flexure can be formed in the sensor die by etching. The sensing element is arranged on the flexure.

Alternatively or additionally, a gap can be arranged between the sensor die and the cap. The gap can be configured to narrow with application of the applied force such that the flexure is unable to deform beyond its breaking point.

Alternatively or additionally, the digital circuitry can be further configured to provide a digital output code based on a plurality of predetermined force thresholds.

An example method for manufacturing a MEMS force sensor is described herein. The method can include forming at least one sensing element on a surface of a force sensor die, and forming complementary metal-oxide-semiconductor ("CMOS") circuitry on the surface of the force sensor die. The at least one sensing element can be configured with a characteristic that is compatible with a downstream CMOS process.

Alternatively or additionally, the at least one sensing element can be formed before forming the CMOS circuitry.

Alternatively or additionally, the characteristic can be a thermal anneal profile of the at least one sensing element.

Alternatively or additionally, the method can further include etching an opposite surface of the force sensor die to form an overload gap, etching the opposite surface of the force sensor die to form a trench, and bonding of a cap wafer to the opposite surface of the force sensor die to seal a cavity between the cap wafer and the force sensor die. The cavity can be defined by the trench.

Alternatively or additionally, the method can further include forming of a plurality of electrical terminals on the opposite surface of the force sensor die.

Alternatively or additionally, the force sensor die can be made of p-type or n-type silicon.

Alternatively or additionally, the at least one sensing element can be formed using an implant or deposition process.

Alternatively or additionally, the CMOS circuitry can be configured to amplify and digitize an analog electrical output signal produced by the at least one sensing element.

Alternatively or additionally, the trench can be configured to increase strain on the at least one sensing element when a force is applied to the MEMS force sensor.

Alternatively or additionally, a depth of the overload gap can be configured to provide overload protection for the MEMS force sensor.

Alternatively or additionally, the electrical terminals can be solder bumps or copper pillars.

An example MEMS switch is also described herein. The MEMS switch can include a sensor die configured to receive an applied force. The sensor die has a top surface and a bottom surface opposite thereto. The MEMS switch can also include a sensing element and digital circuitry arranged on the bottom surface of the sensor die. The sensing element can be configured to convert a strain on the bottom surface of the sensor die to an analog electrical signal that is proportional to the strain. Additionally, the digital circuitry can be configured to convert the analog electrical signal to a digital signal, and provide a digital output code based on a plurality of predetermined force thresholds.

Alternatively or additionally, the digital circuitry can be further configured to compare the digital signal to the predetermined force thresholds. Optionally, the predetermined force thresholds are relative to a baseline. Alternatively or additionally, the digital circuitry can be further configured to update the baseline at a predetermined frequency. For example, the baseline can be updated by comparing the digital signal to an auto-calibration threshold.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE FIGURES

The components in the drawings are not necessarily to scale relative to each other. Like reference numerals designate corresponding parts throughout the several views. These and other features of will become more apparent in the detailed description in which reference is made to the appended drawings.

FIG. 11 is an example truth table describing the outputs of a two-bit digital output.

DETAILED DESCRIPTION

Figure 1:
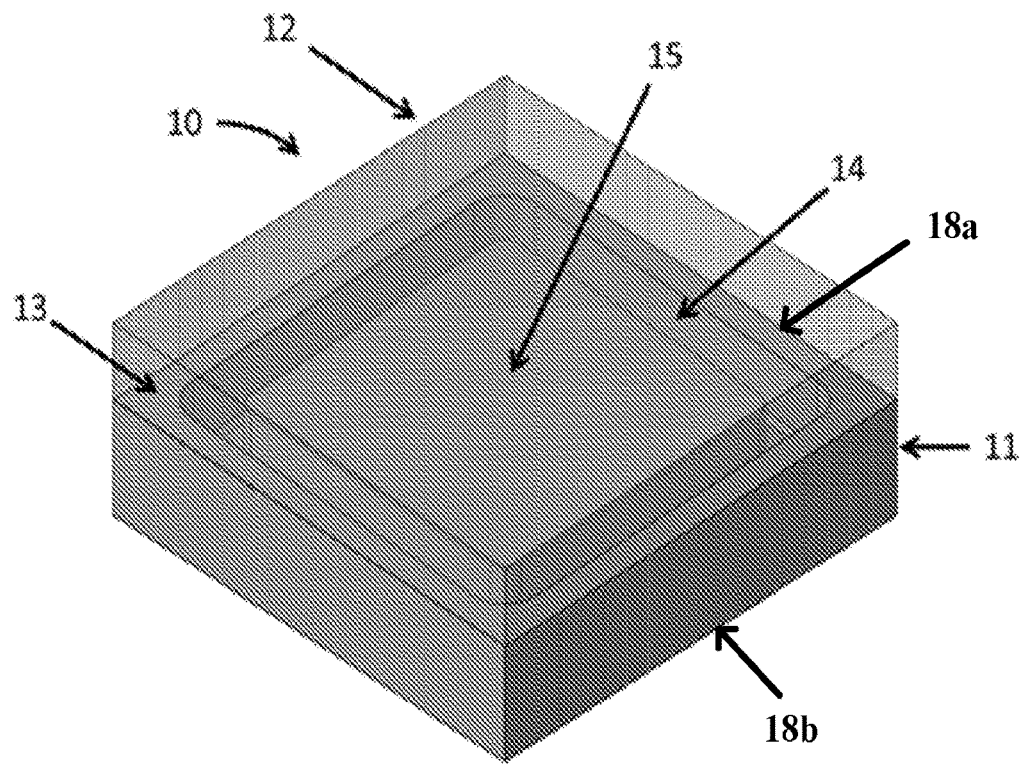
FIG. 1 is an isometric view of the top of an example MEMS force sensor according to implementations described herein.

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an" and "the" include plural referents unless the context clearly dictates otherwise. Thus, for example, reference to "a MEMS force sensor" can include two or more such MEMS force sensors unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

A MEMS force sensor 10 for measuring a force applied to at least a portion thereof is described herein. In one aspect, as depicted in FIGS. 1-4, the force sensor 10 includes a base 11 (also sometimes referred to as a "sensor die" or "force sensor die") and a cap 12. The base 11 and the cap 12 can be bonded at one or more points along the surface formed by an outer wall 13 of the base 11. In other words, the base 11 and the cap 12 can be bonded at a peripheral region of the MEMS force sensor 10. It should be understood that the peripheral region of the MEMS force sensor 10 is spaced apart from the center thereof, i.e., the peripheral region is arranged near the outer edge of the MEMS force sensor 10. Example MEMS force sensors where a cap and sensor die are bonded in peripheral region of the MEMS force sensor are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties. The bonded area(s) can therefore be arranged in proximity to the outer edge of the MEMS force sensor 10 as opposed to in proximity to the central region thereof. This allows the bonded area(s) to take up a large percentage of the surface area between the cap 12 and the base 11, which results in a MEMS force sensor with improved strength and robustness.

The cap 12 can optionally be made of glass (e.g., borosilicate glass) or silicon. The base 11 can optionally be made of silicon. Optionally, the base 11 (and its components such as, for example, the boss, the outer wall, the flexure(s), etc.) is a single continuous piece of material, i.e., the base 11 is monolithic. It should be understood that this disclosure contemplates that the cap 12 and/or the base 11 can be made from materials other than those provided as examples. This disclosure contemplates that the cap 12 and the base 11 can be bonded using techniques known in the art including, but not limited to, silicon fusion bonding, anodic bonding, glass frit, thermo-compression, and eutectic bonding.

Figure 2:
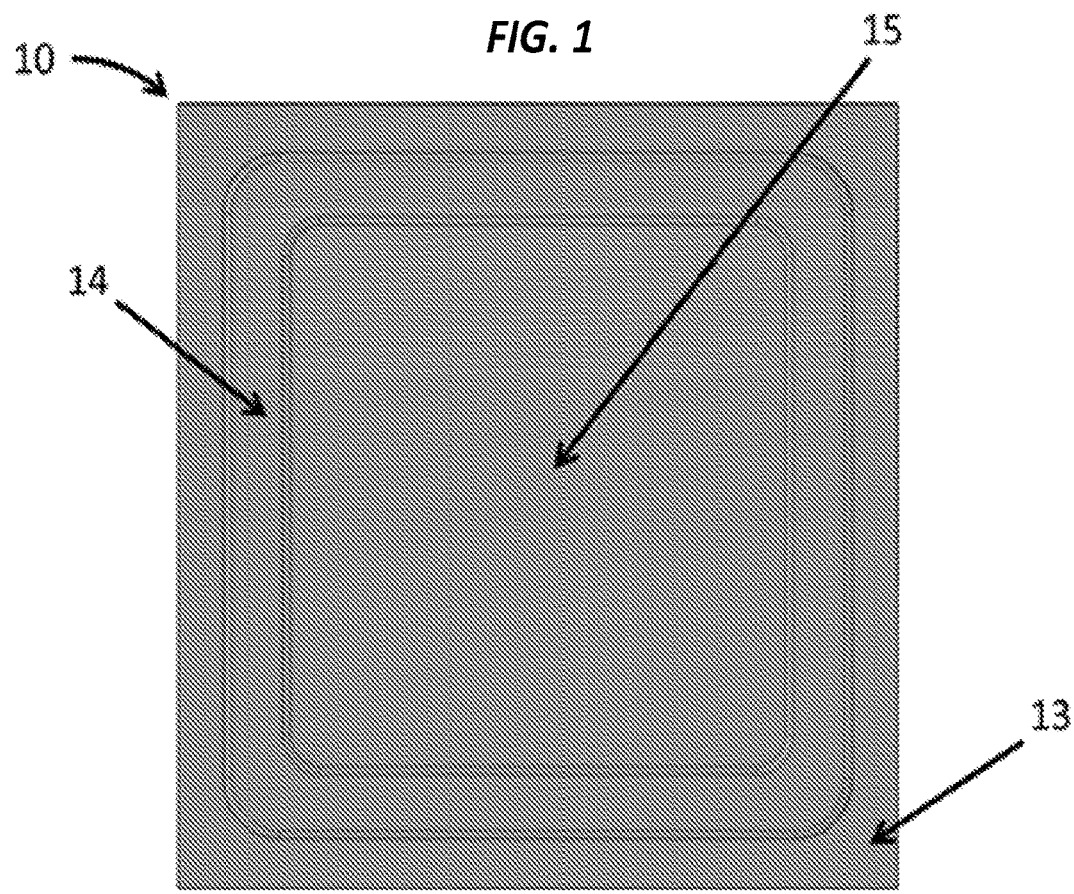
FIG. 2 is a top view of the MEMS force sensor of FIG. 1.
Figure 3:
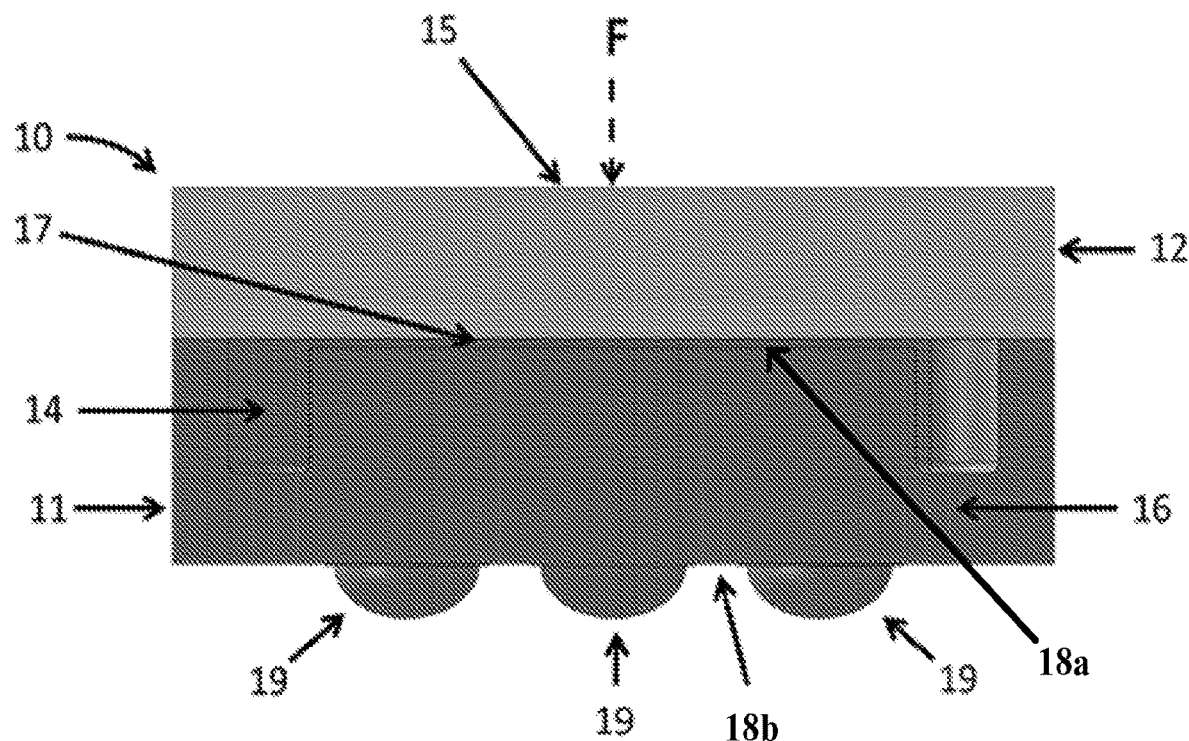
FIG. 3 is a cross-sectional view of the MEMS force sensor of FIG. 1.

The internal surfaces between the base 11 and the cap 12 form a sealed cavity 14. The sealed cavity 14 can be formed by etching a trench (e.g., as described below with regard to FIGS. 5-8) from the base 11 and then sealing a volume between the bonded base 11 and cap 12. For example, the volume is sealed between the base 11 and the cap 12 when adhered together, which results in formation of the sealed cavity 14. The trench can be etched by removing material from the base 11 (e.g., the deep etching process described herein). Additionally, the trench defines the outer wall 13 and at least one flexure 16. In FIGS. 1-3, the trench is continuous and has a substantially square shape. It should be understood that the trench can have other shapes, sizes, and/or patterns than the trench shown in FIGS. 1-3, which is only provided as an example. Optionally, the trench can form a plurality of outer walls and/or a plurality of flexures. Example MEMS force sensors having a cavity (e.g., trench) that defines a flexible sensing element (e.g., flexure) are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties. The sealed cavity 14 can be sealed between the cap 12 and the base 11 when the cap 12 and the base 11 are bonded together. In other words, the MEMS force sensor 10 has a sealed cavity 14 that defines a volume entirely enclosed by the cap 12 and the base 11. The sealed cavity 14 is sealed from the external environment.

The base 11 has a top surface 18a and a bottom surface 18b. The top and bottom surfaces 18a, 18b are arranged opposite to each other. The trench that defines the outer wall 13 and flexure 16 is etched from the top surface 18a of the base 11. A contact surface 15 is arranged along a surface of the cap 12 (e.g., along the top surface thereof) for receiving an applied force "F." The force "F" is transmitted from the cap 12 through the outer wall 13 to at least one flexure 16. The MEMS force sensor 10 can include an air gap 17 (also sometimes referred to as a "gap" or "overload gap") between a portion of the base 11 and cap 12. The air gap 17 can be within the sealed cavity 14. For example, the air gap 17 can be formed by removing material from the base 11 (e.g., the shallow etching process described herein). Alternatively, the air gap 17 can be formed by etching a portion of the cap 12. Alternatively, the air gap 17 can be formed by etching a portion of the base 11 and a portion of the cap 12. The size (e.g., thickness or depth) of the air gap 17 can be determined by the maximum deflection of the at least one flexure 16, such that the air gap 17 between the base 11 and the cap 12 will close and mechanically stop further deflection before the at least one flexure 16 is broken. The air gap 17 provides an overload stop by limiting the amount by which the at least one flexure 16 can deflect such that the flexure does not mechanically fail due to the application of excessive force. Example MEMS force sensors designed to provide overload protection are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Patent Application Publication No. 2016/0332866 to Brosh et al., filed Jan. 13, 2015 and entitled "Miniaturized and ruggedized wafer level mems force sensors;" and U.S. Patent Application Publication No. 2016/0363490 to Campbell et al., filed Jun. 10, 2016 and entitled "Ruggedized wafer level mems force sensor with a tolerance trench," the disclosures of which are incorporated by reference in their entireties.

Figure 4:
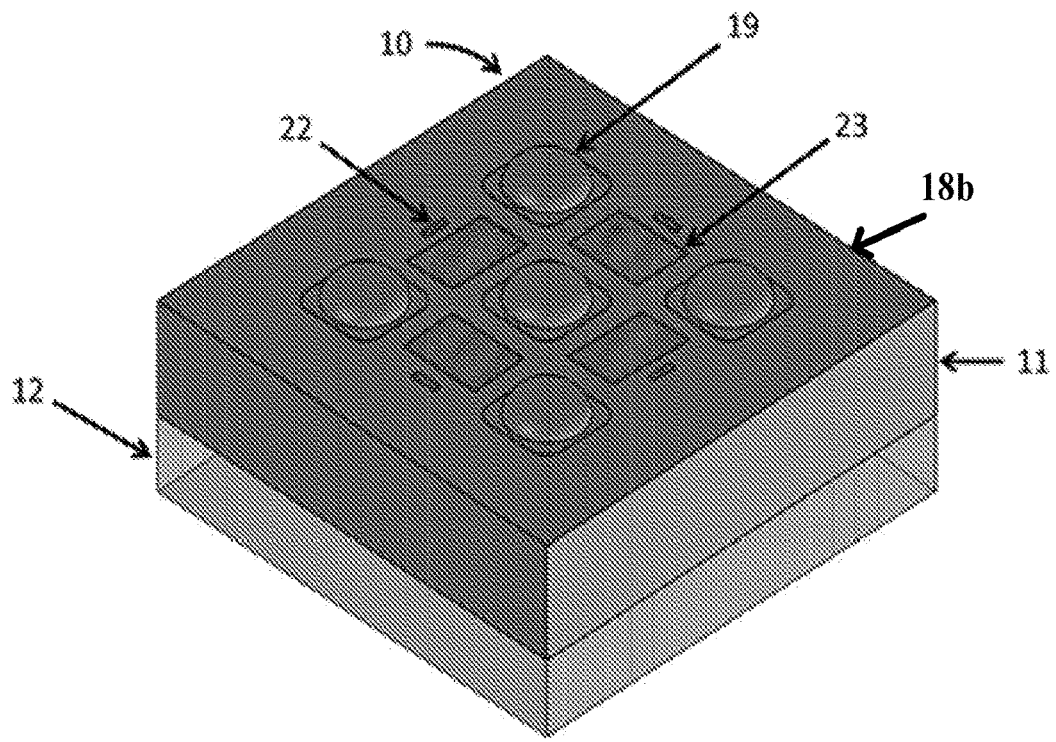
FIG. 4 is an isometric view of the bottom of the MEMS force sensor of FIG. 1.

Referring now to FIGS. 3 and 4, the side and bottom views of the MEMS force sensor 10 are shown, respectively. The MEMS force sensor 10 includes at least one sensing element 22 disposed on the bottom surface 18b of the base 11. Optionally, a plurality of sensing elements 22 can be disposed on the bottom surface 18b of the base 11. This disclosure contemplates that the sensing element(s) 22 can be diffused, deposited, or implanted on the bottom surface 18b of the base 11. The sensing element 22 can change an electrical characteristic (e.g., resistance, capacitance, charge, etc.) in response to deflection of the at least one flexure 16. The change in electrical characteristic can be measured as the analog electrical signal as described herein. In one implementation, the sensing element 22 can optionally be a piezoresistive transducer. For example, as strain is induced in the at least one flexure 16 proportional to the force "F" applied to the contact surface 15, a localized strain is produced on the piezoresistive transducer such that the piezoresistive transducer experiences compression or tension, depending on its specific orientation. As the piezoresistive transducer compresses and tenses, its resistivity changes in opposite fashion. Accordingly, a Wheatstone bridge circuit including a plurality (e.g., four) piezoresistive transducers (e.g., two of each orientation relative to strain) becomes unbalanced and produces a differential voltage (also sometimes referred to herein as an "analog electrical signal") across the positive signal terminal and the negative signal terminal. This differential voltage is directly proportional to the applied force "F" on the cap 12 of the MEMS force sensor 10. As described below, this differential voltage can be received at and processed by digital circuitry (e.g., CMOS circuitry 23), which is also disposed on the base 11. For example, the digital circuitry can be configured to, among other functions, convert the analog electrical signal to a digital electrical output signal. Although piezoresistive transducers are provided as an example sensing element, this disclosure contemplates that the at least one sensing element 22 can be any sensor element configured to change at least one electrical characteristic (e.g., resistance, charge, capacitance, etc.) based on an amount or magnitude of an applied force and can output a signal proportional to the amount or magnitude of the applied force. Other types of sensing elements include, but not limited to, piezoelectric or capacitive sensors.

It is further contemplated that the analog electrical signals produced by the at least one sensing element 22 in a Wheatstone bridge configuration can optionally be processed by digital circuitry that resides on the same surface as the at least one sensing element 22. In one implementation, the digital circuitry is CMOS circuitry 23. The CMOS circuitry 23 can therefore be disposed on the bottom surface 18b of the base 11 as shown in FIG. 4. In other words, both the sensing element 22 and the CMOS circuitry 23 can be provided on the same monolithic substrate (e.g., the base 11, which can optionally be made of silicon). This is as opposed to routing the analog electrical signals produced by the at least one sensing element 22 to digital circuitry external to the MEMS force sensor 10 itself. It should be understood that routing the analog electrical signal to circuitry external to the MEMS force sensor 10 may result in loss of signal integrity due to electrical noise. The CMOS circuitry 23 can optionally include one or more of a differential amplifier or buffer, an analog-to-digital converter, a clock generator, non-volatile memory, and a communication bus. Additionally, the CMOS circuitry 23 can optionally include programmable memory to store trimming values that can be set during a factory calibration. The trimming values can be used to ensure that the MEMS force sensor 10 provides an accurate absolute force output within a specified margin of error. Furthermore, the programmable memory can optionally store a device identifier ("ID") for traceability. CMOS circuitry is known in the art and is therefore not described in further detail below. This disclosure contemplates that the CMOS circuitry 23 can include circuits other than those provided as examples. For example, this disclosure contemplates that CMOS circuitry 23 can optionally include components to improve accuracy, such as an internal voltage regulator or a temperature sensor. As described herein, the differential analog output of the Wheatstone bridge can be amplified, digitized, and stored in a communication buffer until it is requested by a host device. The MEMS force sensor 10 can also include at least one electrical terminal 19 as shown in FIGS. 3 and 4. The electrical terminals 19 can be power and/or communication interfaces used to connect (e.g., electrically, communicatively) to a host device. The electrical terminals 19 can be solder bumps or metal (e.g., copper) pillars to allow for wafer-level packaging and flip-chip assembly. Although solder bumps and copper pillars are provided as examples, this disclosure contemplates that the electrical terminals 19 can be any component capable of electrically connecting the MEMS force sensor 10 to a host device. Additionally, it should be understood that the number and/or arrangement of electrical terminals 19 is provided only as examples in FIGS. 3 and 4.

The process of forming the at least one sensing element 22 and the CMOS circuitry 23 on the same surface (e.g., the bottom surface 18b) of the base 11 can be generalized as a three-stage process. The first stage is the creation of the at least one sensing element 22 by way of either diffusion, deposition, or implant patterned with a lithographic exposure process. The second stage is the creation of the CMOS circuitry 23 through standard CMOS process procedures. And the third stage is the creation of base 11 elements, which includes the outer wall 13, sealed cavity 14, at least one flexure 16, and air gap 17. It is contemplated that these stages can be performed in any order that the manufacturing processes allow.

Figure 5:
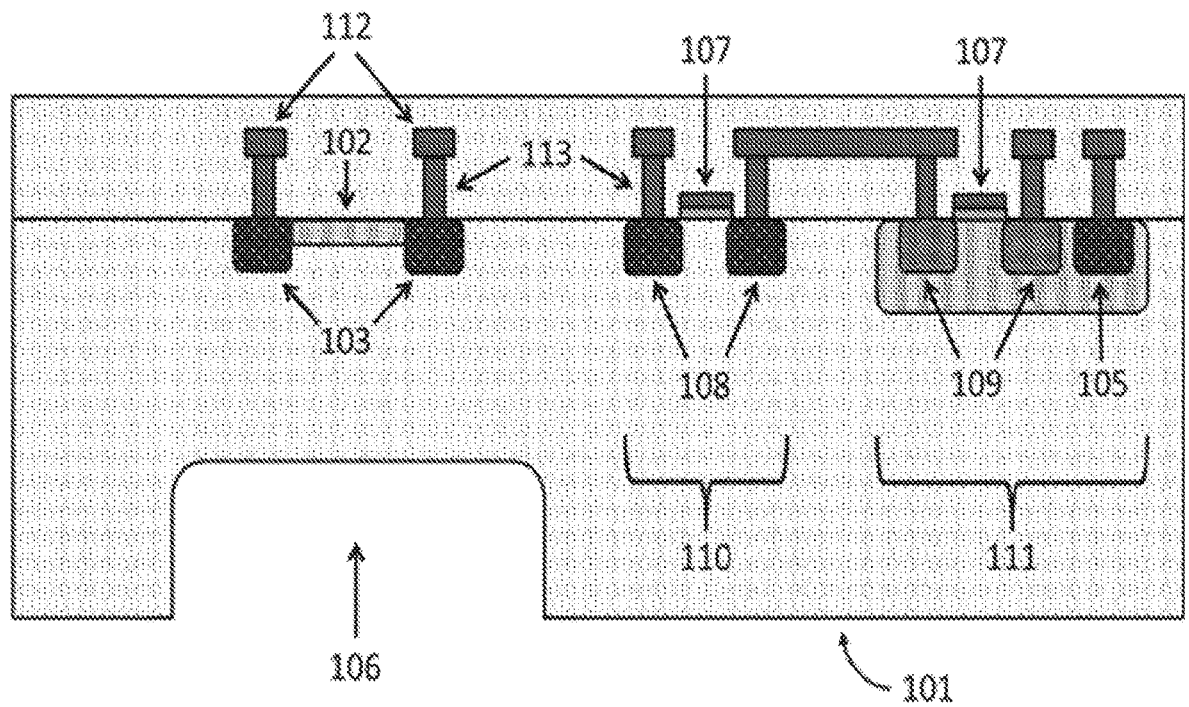
FIG. 5 is a cross-sectional view of an example base wafer of an integrated p-type MEMS-CMOS force sensor using a piezoresistive sensing element (not to scale) according to implementations described herein.
Figure 6:
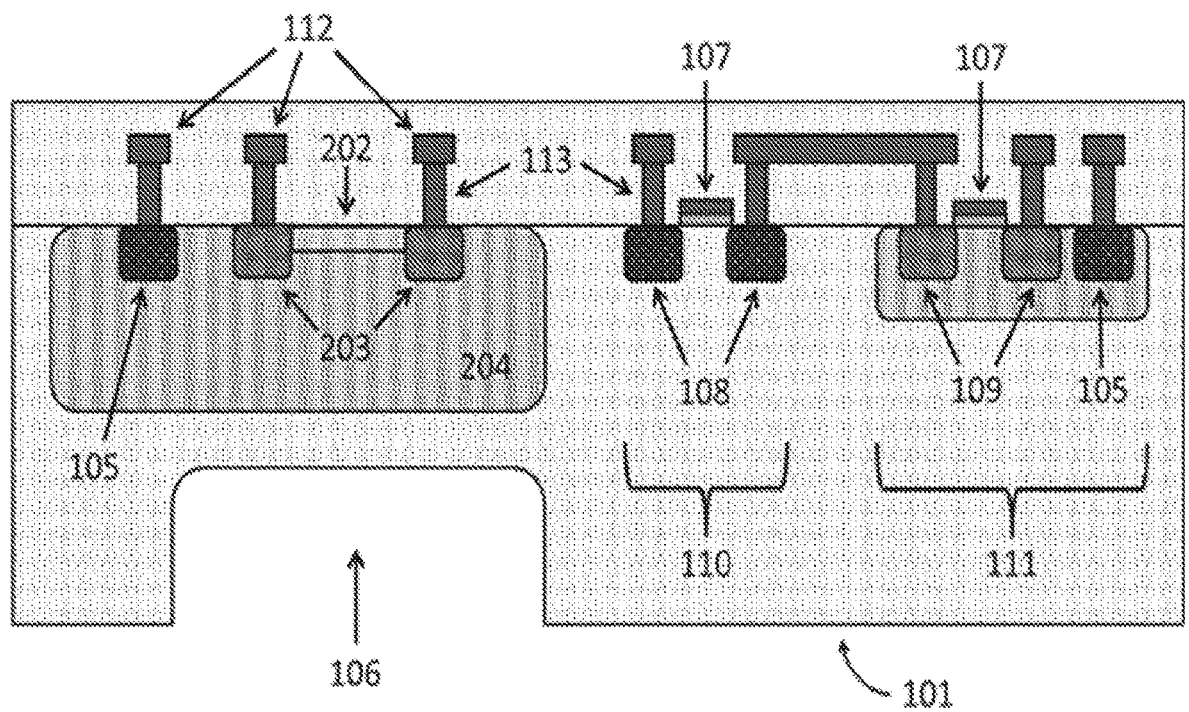
FIG. 6 is a cross-sectional view of an example base wafer of an integrated n-type MEMS-CMOS force sensor using a piezoresistive sensing element (not to scale) according to implementations described herein.

The first stage includes the steps to form the at least one sensing element (e.g., sensing element 22 shown in FIG. 4). Referring now to FIGS. 5 through 8, common CMOS processes begin with a p-type silicon wafer 101. This disclosure contemplates that a p-type silicon wafer can be used to manufacture the MEMS force sensor described above with regard to FIGS. 1-4. It should be understood, however, that similar CMOS processes can be adapted to other starting materials, such as an n-type silicon wafer. Additionally, this disclosure contemplates that semiconductor wafers other than silicon can be used. The sensing element (e.g., at least one sensing element 22 shown in FIG. 4) can be implemented as either an n-type diffusion, deposition, or implant 102 as shown in FIG. 5, or a p-type diffusion, deposition, or implant 202 fully contained in an n-type well 204 as shown in FIG. 6. In the former aspect (i.e., n-type diffusion, deposition, or implant of FIG. 5), the terminals of the sensing element include highly-doped n-type implants 103 that connect to the n-type diffusion, deposition, or implant 102. In the latter aspect (i.e., p-type diffusion, deposition, or implant of FIG. 6), the terminals of the sensing element include highly-doped p-type implants 203 that connect to the p-type diffusion, deposition, or implant 202, while the n-type well 204 receives a voltage bias through a highly-doped n-type implant 105.

Figure 7:
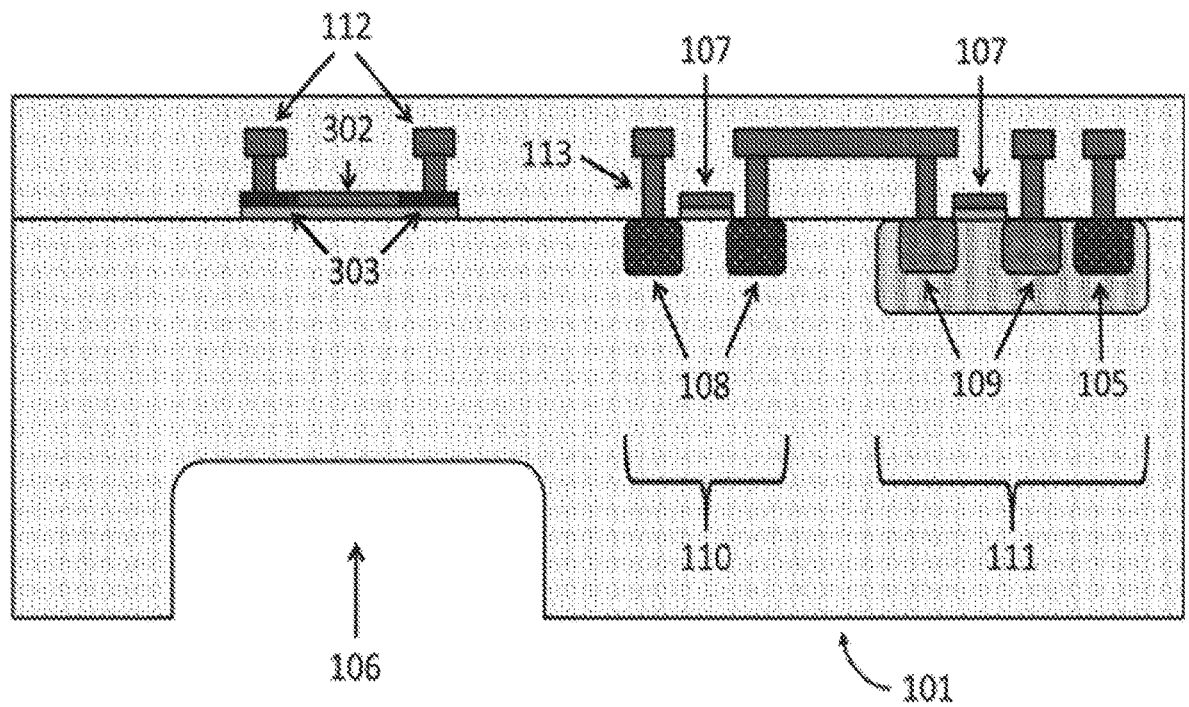
FIG. 7 is a cross-sectional view of an example base wafer of an integrated p-type MEMS-CMOS force sensor using a polysilicon sensing element (not to scale) according to implementations described herein.
Figure 8:
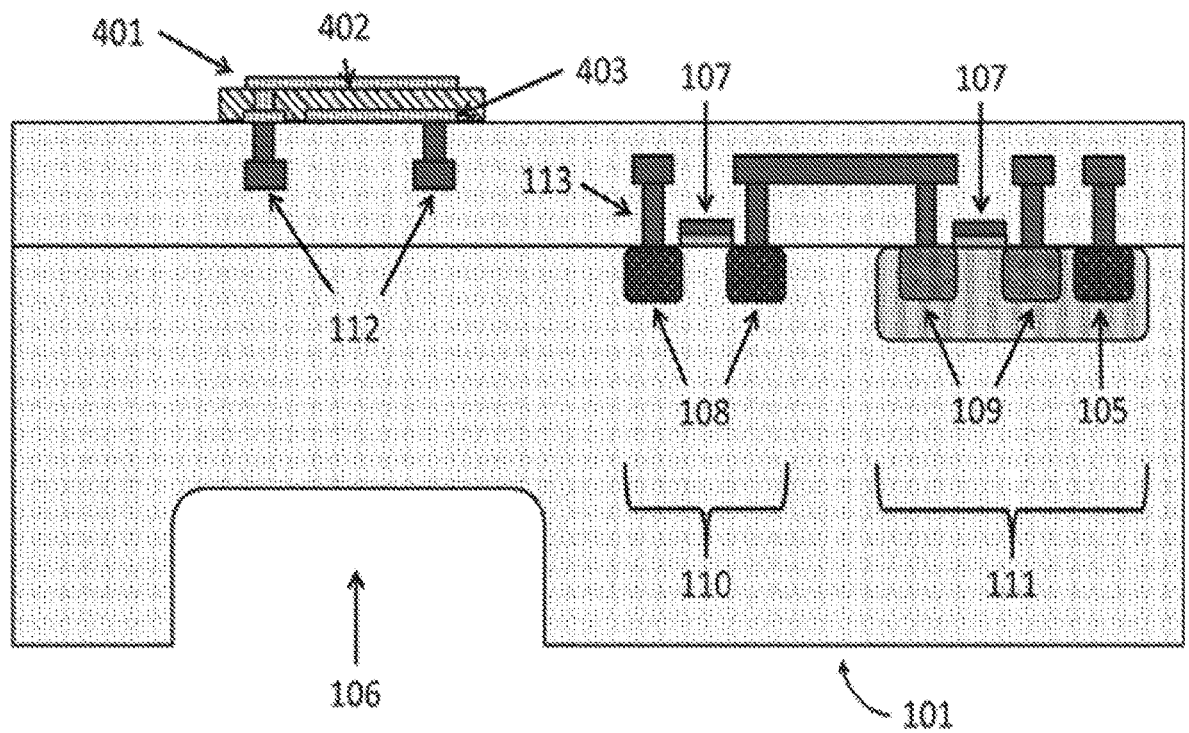
FIG. 8 is a cross-sectional view of an example base wafer of an integrated p-type MEMS-CMOS force sensor using a piezoelectric sensing element (not to scale) according to implementations described herein.

In an alternative aspect, the sensing element can be implemented as either an n-type or p-type poly-silicon implant 302 as shown in FIG. 7, which is available in the common CMOS process as gate or capacitor layers through n-type or p-type implant. As shown in FIG. 7, the terminals of the sensing element include low resistance silicided poly-silicon 303 that connect to the implant 302. In yet another alternative aspect, the sensing element can be implemented with piezoelectric layer 402 in combination with top electrode 401 and bottom electrode 403 as shown in FIG. 8. Additionally, as shown in FIGS. 5-8, the electrical connections between the sensing element and digital circuitry (e.g., CMOS circuitry 23 as shown in FIG. 4) can be implemented with conductive inter-connection layers 112 and vias 113. The inter-connection layers 112 and vias 113 can optionally be made of metal, for example.

The second stage includes the lithographic, implant, anneal, deposition, and etching processes to form the digital circuitry (e.g., CMOS circuitry 23 as shown in FIG. 4). These processes are widely utilized in industry and described in the pertinent art. As such, these processes are not described in detail herein. The second stage can include creation of an NMOS device 110 including n-type source and drain implants 108. The second stage can also include creation of a PMOS device 111 including p-type source and drain implants 109. The p-type source and drain implants 109 are provided in an n-type well, which receives a voltage bias through a highly-doped n-type implant 105. Additionally, each of the NMOS device 110 and PMOS device 111 can include a metal-oxide gate stack 107. It should be understood that the second stage can include creation of a plurality of NMOS and PMOS devices. The NMOS and PMOS devices can form various components of the digital circuitry (e.g., CMOS circuitry 23 shown in FIG. 4). The digital circuity can optionally include other components, which are not depicted in FIGS. 5-8, including, but not limited to, bipolar transistors; metal-insulator-metal ("MIM") and metal-oxide-semiconductor ("MOS") capacitors; diffused, implanted, and polysilicon resistors; and/or diodes.

As described above, the sensing element and digital circuitry (e.g., sensing element 22 and CMOS circuitry 23 shown in FIG. 4) can be disposed on the same monolithic substrate (e.g., the base 11 shown in FIG. 4). This disclosure therefore contemplates that each of the processing steps (i.e., first stage processing steps) utilized in the creation of the sensing element (e.g., at least one sensing element 22 shown in FIG. 4) is compatible with the downstream processing steps (i.e., second stage processing steps) utilized in the creation of the digital circuitry (e.g., CMOS circuitry 23 shown in FIG. 4) in implementations where the sensing element(s) are created before the digital circuitry. For example, the n-type diffusion, deposition, or implant 102 (e.g., as shown in FIG. 5) or the p-type diffusion, deposition, or implant 202 (e.g., as shown in FIG. 6) can be designed such that it will arrive at its target depth after the anneal processes utilized in the creation of the digital circuitry (e.g., CMOS circuitry 23 shown in FIG. 4). Similar design considerations can be made for each of the features described above and related to the sensing element. Alternative processes can include formation of the terminals for the sensing element (e.g., implants 103 shown in FIG. 5 or implants 105, 203 shown in FIG. 6) that are performed at any point during or after formation of the digital circuitry (e.g., CMOS circuitry 23 shown in FIG. 4), which would impose different requirements on the anneal steps.

The third stage includes the MEMS micro-machining steps that are performed on the p-type silicon wafer 101. It should be understood that the p-type silicon wafer 101 of FIGS. 5-8 can correspond to the base 11 of the MEMS force sensor 10 shown in FIGS. 1-4. This disclosure contemplates that the third stage steps can be performed before or after performance of the first and second stages, depending on the capabilities of the manufacturing processes. As described above with regard to FIGS. 1-4, the base 11 can be etched to form the air gap 17, the outer wall 13, and the at least one flexure 16. A shallow etch can form the air gap 17. A deep etch can form the outer wall 13 and the at least one flexure 16. The deep etch is shown by reference number 106 in FIGS. 5-8. As shown in FIGS. 5-8, the sensing element is formed on a surface of the at least one flexure. Thereafter, the base (e.g., base 11 shown in FIGS. 1-4) is bonded to the cap (e.g., cap 12 shown in FIGS. 1-4) as described above. As a result, a sealed cavity (e.g., sealed cavity 14 shown in FIGS. 1-3) is formed. Electrical terminals (e.g., electrical terminals 19 as shown in FIGS. 3-4) can be added after all wafer processing is complete.

Figure 9:
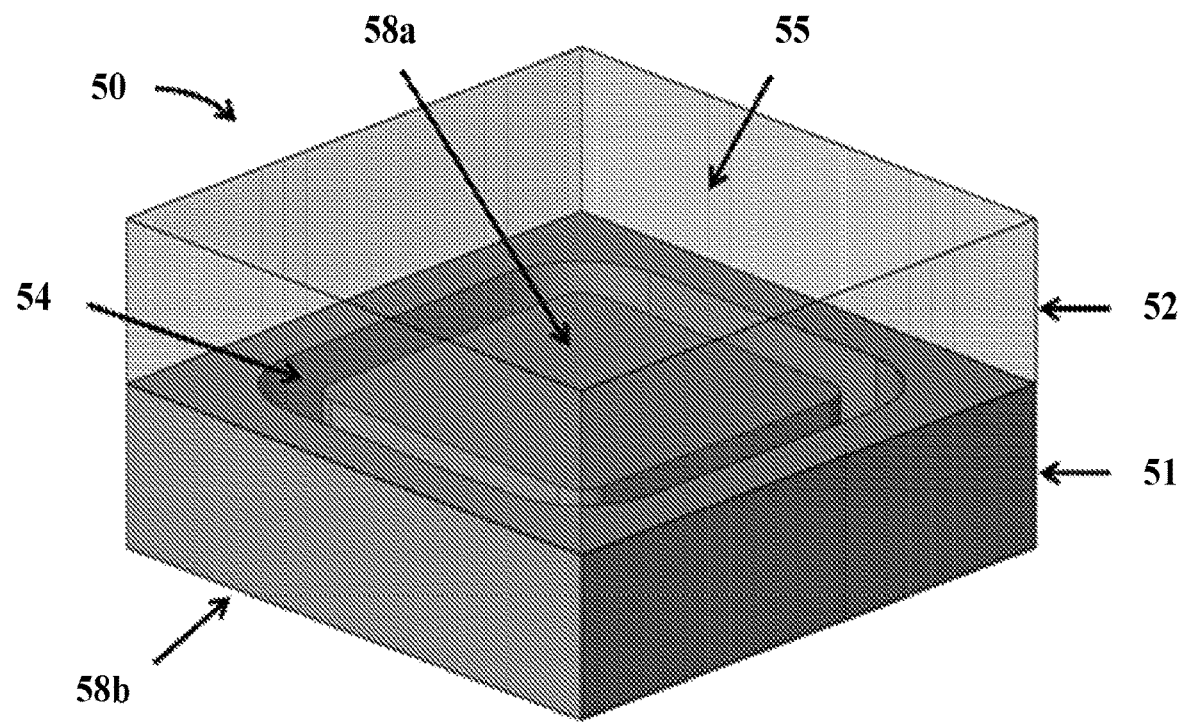
FIG. 9 is an isometric view of the top of an example MEMS switch according to implementations described herein.
Figure 10:
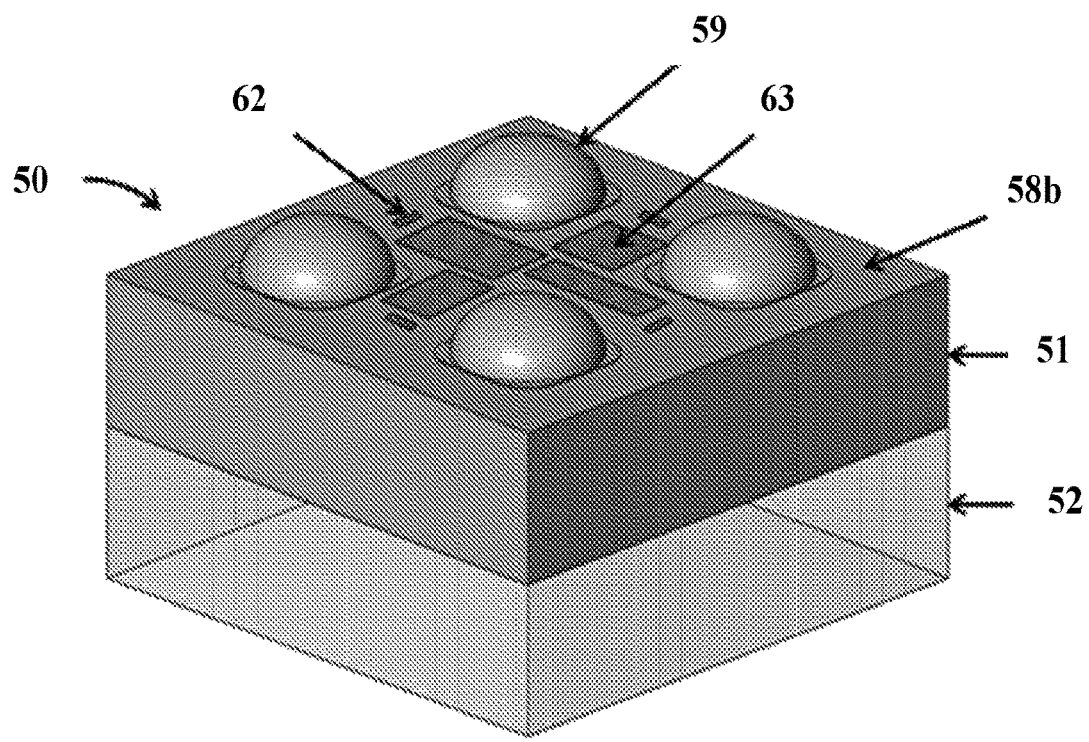
FIG. 10 is an isometric view of the bottom of the MEMS switch of FIG. 9.

A MEMS switch device is also described herein. Referring now to FIGS. 9-10, an example MEMS switch device 50 is shown. The MEMS switch device 50 can include a base 51 having a top surface 58a and a bottom surface 58b. The MEMS switch device 50 can also include a cap 52 bonded to the base 51, which forms a sealed cavity 54 therebetween. As shown in FIG. 10, at least one sensing element 62 and digital circuitry 63 (e.g., CMOS circuitry) are arranged on the bottom surface 58b of the base 51. Electrical terminals 59 are also arranged on the bottom surface 58b of the base 51. The electrical terminals 59 can be used to electrically and/or communicatively connect the MEMS switch device to a host device. The electrical terminals 59 can facilitate wafer-level packaging and flip-chip assembly. Additionally, a contact surface 55 on which force is applied is shown in FIG. 9. When force is applied, it is transferred from the cap 52 to the base 51, where strain is induced in the bottom surface 58b thereof. An electrical characteristic of the sensing element 62 changes in response to the localized strain. This change is captured by an analog electrical signal produced by the sensing element 62. The analog electrical signal is transferred to the digital circuitry 63 for further processing. It should be understood that the MEMS switch device 50 is similar to the MEMS force sensor described above with regard to FIGS. 1-8. Accordingly, various features of the MEMS switch device 50 are not described in further detail below.

As described above, the MEMS switch device 50 can optionally include a plurality of sensing elements 62 configured as a Wheatstone bridge. The analog electrical signals produced by the sensing elements 62 in a Wheatstone bridge configuration can optionally be processed by complementary metal-oxide-semiconductor (CMOS) circuitry (e.g., digital circuitry 63) that resides on the bottom surface 58b of the base 51. In other words, both the sensing elements 62 and the CMOS circuitry can be arranged on the same surface of the base. As described above, the CMOS circuitry can include a differential amplifier or buffer, an analog-to-digital converter, a clock generator, non-volatile memory, and/or one or more digital outputs. The one or more digital outputs can be configured to change state when one or more force thresholds are reached. In this way, the MEMS switch device 50 can be used as a single-level or multi-level binary switch.

Figure 11:
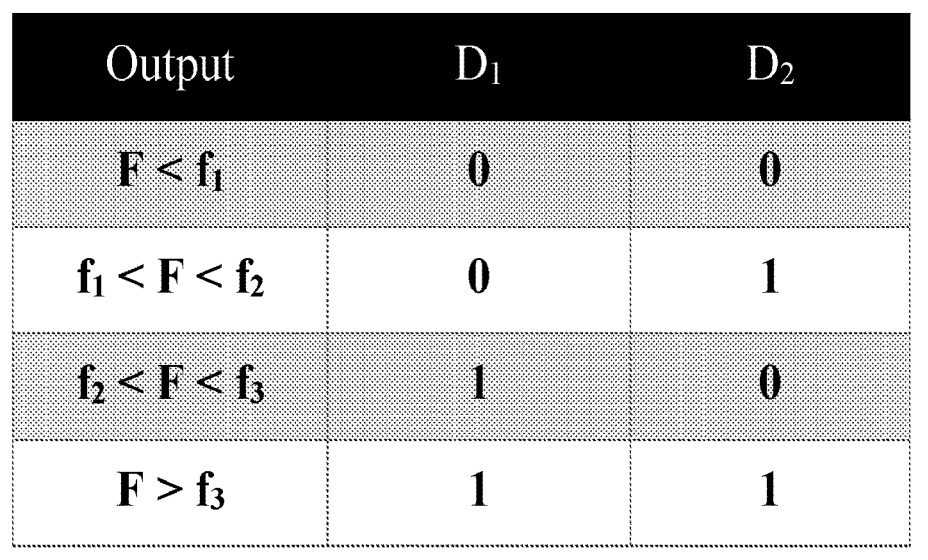

For instance, in one aspect with two digital outputs, three force levels (e.g., predetermined force thresholds) can be programmed above the nominal zero-force, enabling a three-level switch. FIG. 11 is a truth table describing the outputs ($D_1$, $D_2$) of a two-bit digital output (e.g., a digital output code). In FIG. 11, the three force thresholds are $f_1$, $f_2$, and $f_3$. This disclosure contemplates that the number of outputs and the number/value of force thresholds can vary according to the design of the MEMS switch device 50. The digital outputs can be configured to indicate $2^N$ input force levels, where N is the number of output terminals. The digital outputs/input force levels can be programmed by the user.

Additionally, the CMOS circuitry can optionally include programmable memory to store trimming values that can be set during a factory calibration. The trimming values can be used to ensure that the MEMS switch device 50 provides accurate force level detection within a specified margin of error. Furthermore, the programmable memory can optionally store a device ID for traceability. This disclosure contemplates that the CMOS circuitry can include circuits other than those provided as examples. For example, this disclosure contemplates CMOS circuitry optionally including components to improve accuracy, such as an internal voltage regulator or a temperature sensor.

Figure 12:
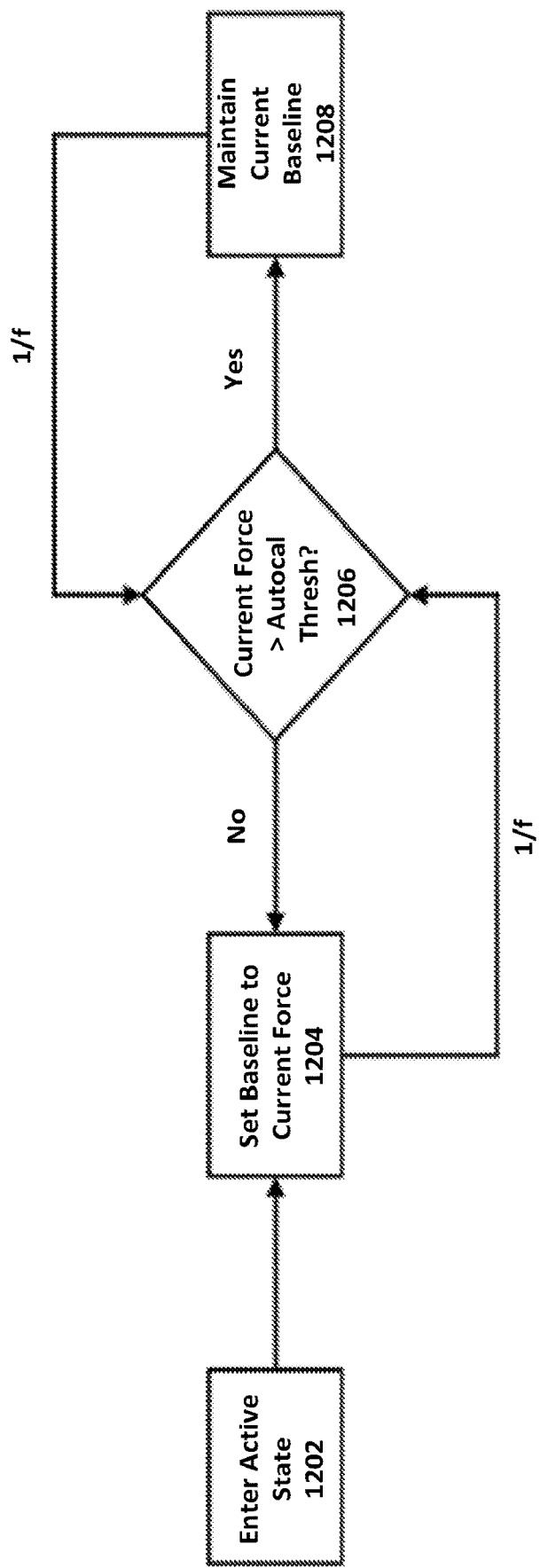
FIG. 12 depicts a flow chart describing an example baselining process.

In one aspect, it may be desirable to maintain consistent force level transitions independent of any offset or static force applied to the MEMS switch device 50. In this aspect, the MEMS switch device 50 can be configured to compare a dynamic force to the programmed force thresholds, filtering any low frequency response caused by various conditions including mechanical preload and temperature variation. This can be achieved by performing a low-frequency baseline operation that compares the current force input to an auto-calibration threshold. FIG. 12 is a flow chart illustrating example operations for the baselining process. At 1202, the MEMS switch device enters an active state, for example, in response to an applied force. At 1204, the baseline is set. At 1206, if the current force input is less than the auto-calibration threshold, the current force input is set as the new baseline until the next operation. In other words, operations return to 1204. On the other hand, at 1206, if the current force input is greater than the auto-calibration threshold, the baseline remains unchanged as shown at 1208. The auto-calibration threshold and frequency of the operation can be programmable in a manner similar to the switching force thresholds, for example, to an auto-calibration threshold of 0.5N and a baselining frequency of 10 Hz. It should be understood that the values for the auto-calibration threshold and baselining frequency are provided only as examples and can have other values.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A microelectromechanical ("MEMS") switch, comprising:
a sensor die configured to receive an applied force, wherein the sensor die comprises a top surface and a bottom surface opposite thereto,
a sensing element arranged on the bottom surface of the sensor die, wherein the sensing element is configured to convert a strain to an analog electrical signal that is proportional to the strain, and
digital circuitry arranged on the bottom surface of the sensor die, wherein the sensing element and the digital circuitry are arranged on the same surface of the sensor die, and wherein the digital circuitry is configured to:
convert the analog electrical signal to a digital signal, and
provide a digital output code based on a plurality of predetermined force thresholds.

2. The MEMS switch of claim 1, wherein the digital circuitry is further configured to compare the digital signal to the predetermined force thresholds.

3. The MEMS switch of claim 1, wherein the predetermined force thresholds are relative to a baseline.

4. The MEMS switch of claim 3, wherein the digital circuitry is further configured to update the baseline at a predetermined frequency.

5. The MEMS switch of claim 4, wherein the baseline is updated by comparing the digital signal to an auto-calibration threshold.

6. The MEMS switch of claim 1, wherein the sensing element is formed by diffusion or implantation.

7. The MEMS switch of claim 1, wherein the sensing element is formed by a polysilicon process from an integrated circuit process.

8. The MEMS switch of claim 1, further comprising a plurality of electrical terminals arranged on the bottom surface of the sensor die, wherein the digital output code provided by the digital circuitry is routed to the electrical terminals.

9. The MEMS switch of claim 8, wherein the electrical terminals comprise solder bumps or copper pillars.

10. The MEMS switch of claim 1, further comprising a cap attached to the sensor die at a surface defined by an outer wall of the sensor die, wherein a sealed cavity is formed between the cap and the sensor die.

11. The MEMS switch of claim 10, wherein the sensor die comprises a flexure formed therein, and wherein the flexure converts the applied force into the strain on the bottom surface of the sensor die.

12. The MEMS switch of claim 11, wherein the flexure is formed in the sensor die by etching.

13. The MEMS switch of claim 10, wherein a gap is arranged between the sensor die and the cap, and wherein the gap is configured to narrow with application of the applied force such that the flexure is unable to deform beyond its breaking point.

14. The MEMS switch of claim 1, wherein the sensing element comprises a piezoresistive, piezoelectric, or capacitive transducer.

* * * * *